(12) United States Patent
Pruetz

(10) Patent No.: US 10,519,029 B2
(45) Date of Patent: Dec. 31, 2019

(54) MICROMECHANICAL COMPONENT

(71) Applicant: Robert Bosch GmbH, Stuttgart (DE)

(72) Inventor: Odd-Axel Pruetz, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 145 days.

(21) Appl. No.: 15/683,420

(22) Filed: Aug. 22, 2017

(65) Prior Publication Data
US 2018/0057352 A1 Mar. 1, 2018

(30) Foreign Application Priority Data
Aug. 23, 2016 (DE) .................. 10 2016 215 829

(51) Int. Cl.
*B81B 3/00* (2006.01)
*G01P 15/125* (2006.01)

(52) U.S. Cl.
CPC .......... *B81B 3/0051* (2013.01); *G01P 15/125* (2013.01); *B81B 2201/0235* (2013.01); *B81B 2201/0242* (2013.01); *B81B 2203/0136* (2013.01)

(58) Field of Classification Search
USPC ............ 248/562, 618, 636, 638; 267/140.11; 181/208, 288, 290
See application file for complete search history.

(56) References Cited

U.S. PATENT DOCUMENTS

| | | | | |
|---|---|---|---|---|
| 3,952,980 A | * | 4/1976 | Von Pragenau | F16F 1/36 248/636 |
| 4,699,006 A | * | 10/1987 | Boxenhorn | G01C 19/5719 257/417 |
| 4,778,028 A | * | 10/1988 | Staley | F16F 7/108 181/208 |
| 5,286,013 A | * | 2/1994 | Seymour | F16F 9/103 188/316 |
| 5,364,086 A | * | 11/1994 | Paton | B60G 11/465 248/562 |
| 5,692,728 A | * | 12/1997 | Shiozawa | B23Q 3/18 248/562 |
| 5,738,330 A | * | 4/1998 | Folkens | F16F 1/40 248/632 |
| 5,971,347 A | * | 10/1999 | Tsai | F16F 15/02 248/618 |
| 6,170,332 B1 | * | 1/2001 | MacDonald | B81C 1/00619 73/514.32 |
| 6,425,568 B1 | * | 7/2002 | Brunken, Jr. | F16C 39/063 248/562 |
| 7,290,759 B1 | * | 11/2007 | Lavrencik | F16F 15/08 267/140.11 |
| 7,398,964 B2 | * | 7/2008 | Knowles | B29C 48/14 267/136 |

(Continued)

*Primary Examiner* — Monica E Millner
(74) *Attorney, Agent, or Firm* — Norton Rose Fulbright US LLP; Gerard Messina

(57) ABSTRACT

A micromechanical component is provided, the micromechanical component including a deflection device which is deflectable parallel to a deflection direction, and the micromechanical component including a damping device, a surface of the deflection device facing the damping device being greater than a sectional area of the deflection device disposed perpendicular to the deflection direction and situated in a region of the deflection device that is facing away from the damping device.

12 Claims, 4 Drawing Sheets

(56) References Cited

U.S. PATENT DOCUMENTS

| | | | | |
|---|---|---|---|---|
| 7,441,731 B2* | 10/2008 | Smart | ...................... | F16L 3/02 |
| | | | | 248/68.1 |
| 8,132,771 B2* | 3/2012 | Lee | .......................... | B60P 7/08 |
| | | | | 108/53.1 |
| 9,528,271 B2* | 12/2016 | Rook | ...................... | E04H 12/12 |
| 9,739,998 B2* | 8/2017 | Muchow | ................ | G02B 26/00 |
| 2017/0052207 A1* | 2/2017 | Classen | ................. | G01P 15/125 |

* cited by examiner

MICROMECHANICAL COMPONENT

RELATED APPLICATION INFORMATION

The present application claims priority to and the benefit of German patent application no. 10 2016 215 829.5, which was filed in Germany on Aug. 23, 2016, the disclosure which is incorporated herein by reference.

FIELD OF THE INVENTION

The present invention is based on a micromechanical component.

BACKGROUND INFORMATION

Such a micromechanical component is believed to be generally understood. Here, damping forces are acting on the deflection device and the damping device while the micromechanical component is in operation, and the damping forces affect the deflection of the deflection device along the deflection direction.

SUMMARY OF THE INVENTION

It is an object of the present invention to provide a micromechanical component that is compact, durable and resource-sparing in comparison with the related art, and to do so in an uncomplicated and economical manner.

The objective is achieved in that a surface of the deflection device facing the damping device is larger than a sectional area of the deflection device disposed at a right angle to the deflection direction and situated in a region of the deflection device that is facing away from the damping device.

This advantageously makes it possible to provide a micromechanical component that has a surface that faces the damping device and is enlarged in comparison with the related art, in particular without modifying the deflection device to any significant degree as a consequence. Enlarging the surface in particular allows for a selective adjustment of and especially for an increase in the damping forces that are acting between the deflection device and the damping device. In an advantageous manner, mechanical clipping, for example, is thereby able to be avoided or markedly reduced. In other words, the present invention makes it possible to provide a micromechanical component that offers a better clipping performance in comparison with the related art. Also, since the surface is larger than the sectional area, it is advantageously possible to provide a large surface and to simultaneously provide a particularly light and material-saving construction of the micromechanical component. In addition, the use of the micromechanical component according to the present invention advantageously makes it possible to provide especially high damping forces on a relatively small substrate surface. Thus, the present invention provides a micromechanical component that is compact, durable and resource-sparing in comparison with the related art and does so in an uncomplicated and cost-effective manner.

In connection with the present invention, the term "micromechanical component" is to be understood to encompass both micromechanical components and micro-electromechanical components. The micromechanical component may include a rate-of-rotation sensor, i.e. a sensor core for measuring a rate of rotation present at the micromechanical component. Alternatively or additionally, the micromechanical component according to the present invention may include an acceleration sensor, i.e. a sensor core for measuring an acceleration present at the micromechanical component.

The deflection device may include a seismic mass or a Coriolis mass.

In addition, the deflection device is attached to a substrate of the micromechanical component in a deflectable manner, which may be with the aid of springs and substrate linkages, especially so as to allow a deflection along the deflection direction. Moreover, the damping device is attached to the substrate of the micromechanical component in a deflectable manner, which may be with the aid of additional springs and additional substrate linkages, and especially so as to allow a deflection along the deflection direction.

In addition, the damping forces may result from environmental damping, such environmental damping occurring especially when the system or the deflection device and/or the damping device is/are not oscillating in a vacuum but in a medium that surrounds the deflection device and the damping device. According to the present invention, the medium may be in motion and/or the medium is at rest. Especially particularly, the damping forces may result on account of hydrodynamic damping in a moving medium and/or result on account of hydrostatic friction in a medium at rest. In addition, the medium may be situated in a cavern of the micromechanical component together with the deflection device and the damping device.

Advantageous further developments and further refinements of the present invention may be gathered from the further descriptions herein as well as from the specification with reference to the drawing(s).

According to a further development, an extension of the surface perpendicular to a main extension plane of a substrate of the micromechanical component running parallel to the deflection direction is greater than an extension of the sectional area perpendicular to the main extension plane. This advantageously makes it possible to enlarge the surface with the aid of an additional layer, meaning that a surface that is enlarged in comparison with the related art is advantageously able to be provided on a substrate surface that is essentially unchanged or smaller than in the related art. In this way, a particularly compact micromechanical component is provided in an uncomplicated manner.

According to a further development, an extension of the surface parallel to a main extension plane of a substrate of the micromechanical component running parallel to the deflection direction is greater than an extension of the sectional area parallel to the main extension plane. This advantageously makes it possible to realize the enlargement of the surface within a layer. In an advantageous manner, a surface that is enlarged in comparison with the related art is therefore able to be provided with a thickness of one or more layers that is comparable to or reduced in comparison with the related art. A particularly compact micromechanical component, especially a flat micromechanical component, i.e. one that has a small extension perpendicular to the main extension plane in comparison with the related art, is thereby made available in an uncomplicated manner.

According to a further development, a further surface of the damping device facing the deflection device is larger than a further sectional area of the damping device disposed perpendicular to the deflection direction and situated in a further region of the damping device that faces away from the deflection device. This advantageously makes it possible to provide a micromechanical component that has a further surface that is facing the deflection device and is enlarged in comparison with the related art, in particular without significantly modifying the damping device in the process. An enlargement of the further surface in particular makes it possible to selectively adjust, and especially increase, the damping forces that are acting between the deflection device and the damping device, thereby advantageously avoiding or markedly reducing mechanical clipping, for example. In addition, because the further surface is larger than the further sectional area, it is advantageously possible to provide a large further surface and, at the same time, an especially light and material-saving construction of the micromechanical component. As a result, a durable, compact and resource-sparing micromechanical component in comparison with the related art is provided in an uncomplicated and cost-effective manner.

According to a further development, an extension of the further surface perpendicular to a main extension plane of a substrate of the micromechanical component running parallel to the deflection direction is greater than an extension of the further sectional area perpendicular to the main extension plane. This advantageously makes it possible to realize the enlargement of the further surface with the aid of an additional layer. In an advantageous manner, a further surface that is enlarged in comparison with the related art is realizable on a substrate surface that is essentially unchanged from the related art or smaller than in the related art. A particularly compact micromechanical component is thereby provided in an uncomplicated manner.

According to a further development, an extension of the further surface parallel to a main extension plane of a substrate of the micromechanical running parallel to the deflection direction is greater than an extension of the further sectional area parallel to the main extension plane. This advantageously makes it possible to realize the enlargement of the further surface within a layer. In an advantageous manner, a further surface that is enlarged in comparison with the related art with a thickness of a layer or a plurality of layers that is comparable to or reduced in comparison with the related art, is thereby realizable. As a result, a particularly compact, especially a flat micromechanical component, i.e. one that has a small extension perpendicular to the main extension plane in comparison with the related art, is provided in a uncomplicated manner.

According to a further development, the damping device is deflectable parallel to the deflection direction, and the micromechanical component is configured in such a way that a deflection of the deflection device along the deflection direction causes a deflection of the damping device counter to the deflection direction. This advantageously makes it possible to develop the micromechanical component in such a way that the deflection device and the damping device are deflectable essentially in an antiparallel manner with respect to each other. In particular, this advantageously allows for a considerably greater variation of a distance between the deflection device and the damping device in comparison with the related art in a movement of the deflection device parallel to the deflection direction, in particular without significantly modifying the deflection device and/or the damping device, especially the geometry of the deflection device and/or the geometry of the damping device. Because the deflection device and the damping device are essentially deflectable in an antiparallel manner with respect to each other, the damping forces acting between the deflection device and the damping device are able to be adjusted in a selective manner, and in particular increased. For example, this advantageously avoids mechanical clipping, or reduces such clipping considerably further. In addition, this advantageously makes it possible to provide even greater damping forces on even smaller substrate surfaces.

According to a further development, the micromechanical component is configured in such a way that a first projection of the deflection device onto a main extension plane of a substrate of the micromechanical component extending parallel to the deflection direction, and a second projection of the damping device onto the main extension plane overlap. This advantageously allows for a particularly space-saving, especially a substrate-surface-saving mechanical coupling of different regions of the deflection device with one another and/or of different regions of the damping device with one another.

According to a further development, the damping device encompasses a third region and a fourth region that is separated from the third region, which may be galvanically. This advantageously allows the micromechanical component to be configured in such a way that the damping device includes a first damping element, which may be a damping finger, and a second damping element, which may be a first counter-electrode element. The first damping element is coupled with the third region, and the second damping element is coupled with the fourth region. As a result, this advantageously makes it possible for the first damping element and the second element to interact with the deflection device independently, in particular in an electrically insulated manner. In an advantageous manner, a micromechanical component is therefore provided which includes a damping device, and the damping device includes both electrically neutral damping elements and electrical damping elements, such as electrodes, either on their own or in combination in each case. This allows for a particularly precise adjustment of the damping forces that are acting on the deflection device and on the damping device.

According to a further development, the damping device includes a fifth region, which is separated from the third region and/or from the fourth region, which may be galvanically. This advantageously allows for a development of the micromechanical component such that the damping device includes a first damping element, which may be a damping finger, a second damping element, which may be a first counter-electrode element, and a third damping element, which may be a second counter-electrode element. The first damping element is coupled with the third region, the second damping element is coupled with the fourth region, and/or the third damping element is coupled with the fifth region. Thus, it is advantageously possible for the first damping element and the second damping element and/or the third damping element to independently interact with the deflection device, in particular in an electrically insulated manner from one another. This advantageously provides a micromechanical component that encompasses a damping device, the damping device including both electrically neutral damping elements and electrical damping elements such as electrodes, by themselves or in combination in each case. This allows for a particularly precise adjustment of the damping forces acting on the deflection device and on the damping device.

DETAILED DESCRIPTION

Figure 1:
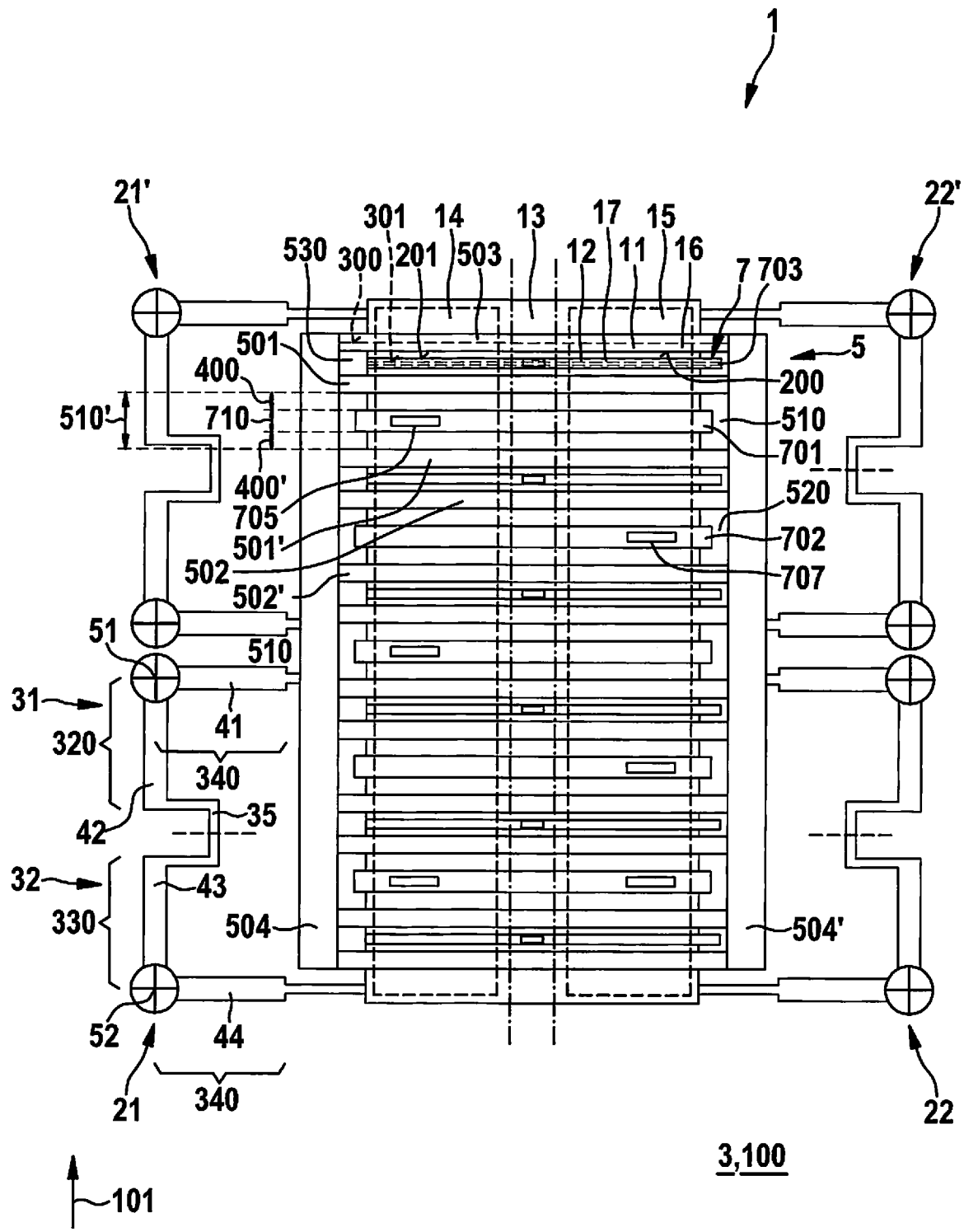
FIG. 1 shows a schematic representation of micromechanical components according to an exemplary embodiment of the present invention.

Identical components have always been provided with the same reference numerals in the various figures and are therefore also denoted or mentioned only once as a rule.

Figure 3:
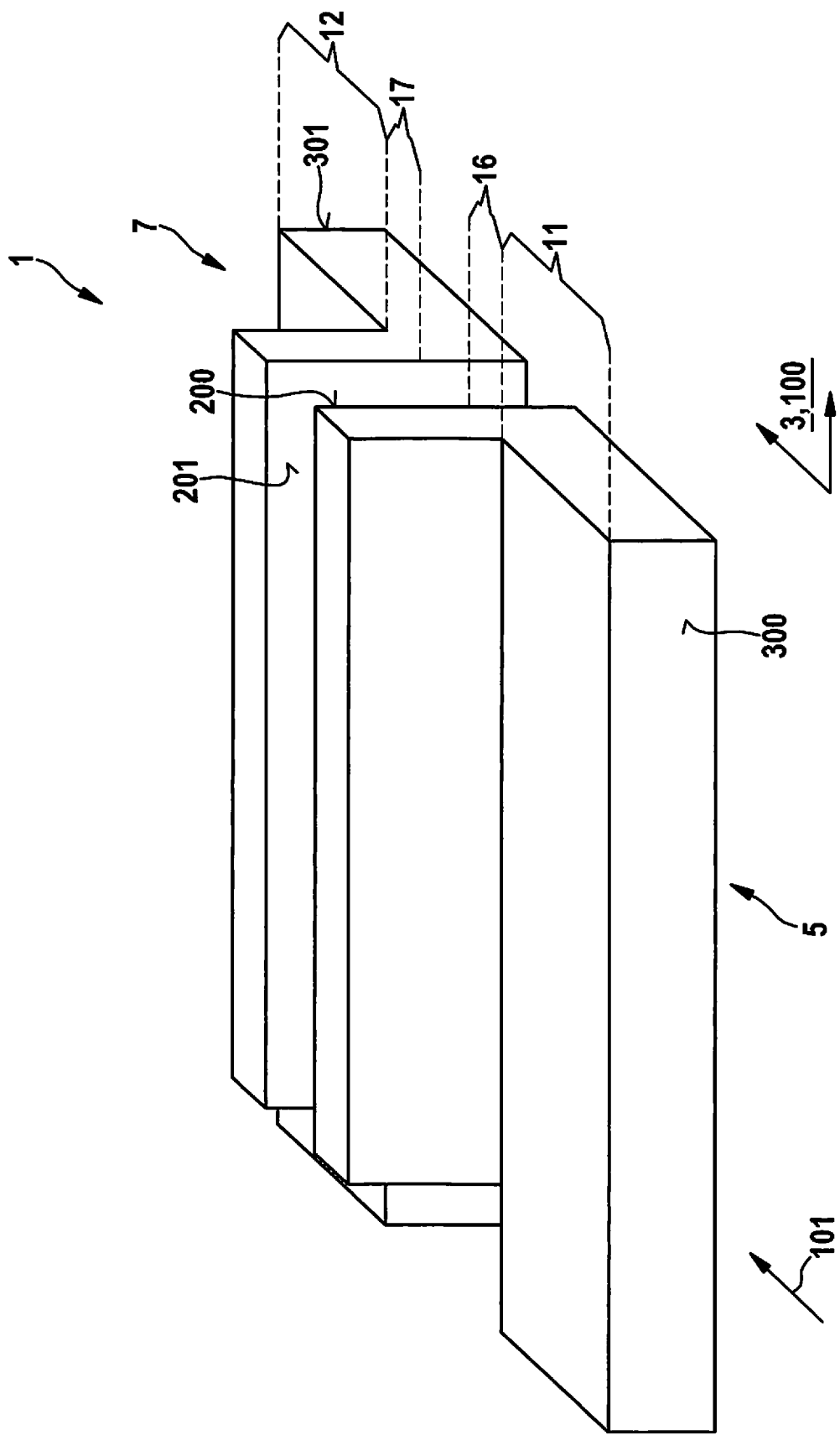
FIG. 3 shows another schematic representation of micromechanical components according to an exemplary embodiment of the present invention.

FIG. 1, FIG. 3 and FIG. 3 show schematic representations of micromechanical components 1 according to exemplary specific embodiments of the present invention.

Micromechanical component 1 includes a deflection device 5, which is able to be deflected parallel to a deflection direction 101, and a damping device 7. A surface 200 of deflection device 5 facing damping device 7 may be larger than a sectional area 300 of deflection device 5 disposed perpendicular to deflection direction 101 and situated in a region 11 of deflection device 5 facing away from damping device 7. A projection of deflection device 5 onto a projection surface extending in a perpendicular direction to main extension plane 100 and a projection of damping device 7 onto the projection surface may overlap.

Micromechanical component 1 may encompass a substrate 3 having a main extension plane 100. Main extension plane 100 may be disposed parallel to deflection direction 101. Alternatively, main extension plane 100 may be situated in a perpendicular direction to deflection direction 101.

In addition, an extension of surface 200 perpendicular to main extension plane 100 may be greater than an extension of sectional area 300 perpendicular to main extension plane 100. As an alternative or in addition, it may be provided that an extension of surface 200 parallel to main extension plane 100 is greater than an extension of sectional area 300 parallel to main extension plane 100.

According to the present invention, deflection device 5 may include a plurality of mechanically functional planes or layers in such a way that the extension of surface 200 perpendicular to main extension plane 100 is greater than an extension of sectional area 300 perpendicular to main extension plane 100. In other words, a height h1 of deflection device 5 is realized by local increases in the layer thickness with the aid of a suitable production process, which may be with multiple mechanical functional planes, without significantly modifying deflection device 5 in the process. This means that a layer thickness h1 may prevail in large regions of deflection device 5, or deflection device 5 includes a layer thickness h1, which may be perpendicular to main extension plane 100. A greater layer height h2 in small areas prevails only at the damping structures or in regions of deflection device 5 facing damping device 7, i.e. deflection device 5 includes a greater layer thickness h2, which may be perpendicular to main extension plane 100. Greater layer thickness h2 may be two times greater here, which may be more than three times greater, and most particularly, more than four times greater than layer thickness h1.

In addition, a further surface 201 of damping device 7 facing deflection device 5 may be greater than a further sectional area 301 of damping device 7 disposed perpendicular to deflection direction 101 and situated in a further region 12 of damping device 7 facing away from deflection device 5.

An extension of further surface 201 perpendicular to main extension plane 100 may be greater than an extension of further sectional area 301 perpendicular to main extension plane 100. Alternatively or additionally, an extension of further surface 201 parallel to main extension plane 100 may be greater than an extension of further sectional area 301 parallel to main extension plane 100.

In addition, damping device 7 may be deflectable parallel to deflection direction 101. For example, micromechanical component 1 is configured in such a way here that a deflection of deflection device 5 along deflection direction 101 causes a deflection of damping device 7 counter to deflection direction 101. Thus, a micromechanical component 1 is provided which encompasses damping elements that no longer include a movable and a static structure but encompass two movable structures, both of which are able to be moved towards each other and/or away from each other, or which move towards each other and/or away from each other during an operation of micromechanical component.

In addition, micromechanical component 1 shown by way of example in FIG. 1 may be configured in such a way that a first projection of deflection device 5 onto main extension plane 100 and a second projection of damping device 7 onto main extension plane 100 overlap.

Moreover, damping device 7 may include a third region 13 as well as a fourth region 14 that is separated from third region 13, which may be separated galvanically or insulated electronically, in particular. For example, it is also provided that damping device 7 includes a fifth region 15, which is separated, which may be galvanically or insulated electronically, from third region 13 and/or fourth region 14. Fourth region 14 may be configured as a carrier element 14, and/or fifth region 15 is configured as a further carrier element 15, the two carrier elements 14, 15 particularly being configured as planar plate electrodes 14, 15 which predominantly extend parallel to main extension plane 100. In addition, carrier element 14 and/or further carrier element 15 is/are configured from a first function layer having a first function plane parallel to main extension plane 100.

In addition, deflection device 5 may include a first element 501. First element 501 may be configured as an electrode element 501, especially in the form of a bar electrode. Alternatively or additionally, first element 501 is configured as a damping element.

In addition, first element 501 may extend at a right angle to deflection direction 101 and parallel to main extension plane 100. Micromechanical component 1 may include a further first element 501', which is connected to first element 501 by way of a connection element 504 of deflection device 5 that extends essentially parallel to deflection direction 101, the connection particularly being implemented as an electrically conductive and/or immovable, i.e. rigid, connection. In addition, micromechanical component 1 may include a further connection element 504', which extends essentially parallel to deflection direction 101. Moreover, first element 501 and further first element 501' are connected to each other via further connection element 504', which may be in an electrically conductive and/or immovable, i.e. rigid, manner. Here, first element 501 and further first element 501' may be disposed so as to overlap along a projection direction that runs parallel to deflection direction 101.

As illustrated in the exemplary embodiment of micromechanical component 1 shown in FIG. 1, deflection device 5 may include a recess 510, and especially particularly, three recesses 510.

Along a direction perpendicular to main extension plane 100, recess 510 extends completely through deflection device 5. In addition, micromechanical component 1 may be configured in such a way that recess 510 is enclosed by deflection device 5 in a plane parallel to main extension plane 100. Recess 510 may be enclosed by first element 501, further first element 501', connection element 504, and further connection element 504' in the plane parallel to main extension plane 100.

Deflection device 5 may include a second element 502 and a further second element 502', second element 502 and further second element 502' essentially being configured and disposed like first element 501 and further first element 501'. In addition, deflection device 5 may include a third element 503, which is configured and situated essentially like first element 501.

Furthermore, deflection device 5 shown in FIG. 1 by way of example may include a second recess 520, and especially particularly, two second recesses 520, second recess 520 being configured and oriented essentially like recess 510. Micromechanical component 1 may be configured in such a way that second recess 520 is enclosed by deflection device 5 in a plane parallel to main extension plane 100. Second recess 520 may be enclosed by second element 502, further second element 502', connection element 504, and further connection element 504' in the plane parallel to main extension plane 100.

In addition, deflection device 5 may include a third recess 530, and especially particularly, six third recesses 530, the third recess 530 essentially being configured and oriented like recess 510. Micromechanical component 1 may be configured in such a way that third recess 530 is enclosed by deflection device 5 in a plane parallel to main extension plane 100. Third recess 530 may be enclosed by first element 501, third element 503, connection element 504, and further connection element 504' in the plane parallel to main extension plane 100. In addition, third recess 530 may be enclosed by first element 501, third element 503, connection element 504, and further connection element 504' in the plane parallel to main extension plane 100.

An extension of third recess 530 parallel to deflection direction 101 may be less than an extension of recess 510 and/or second recess 520 parallel to deflection direction 101. The extension of recess 510 and/or second recess 520 parallel to deflection direction 101 may be more than two times greater, and particularly more than three times greater, and most particularly, more than four times greater than the extension of third recess 530 parallel to deflection direction 101.

In addition, damping device 7 may include a first counter-electrode element 701, and especially particularly, three first counter-electrode elements 701, and/or a second counter-electrode element 702, and especially particularly, two second counter-electrode elements 702. Here, damping device 7 may be configured in such a way that first counter-electrode element 701 is immovably coupled with fourth region 14, and/or second counter-electrode element 702 is immovably coupled with fifth region 15. In addition, first counter-electrode element 701 may be disposed in recess 510, and/or second counter-electrode element 702 may be disposed in second recess 520. Micromechanical component 1 may be configured in such a way that first counter-electrode element 701 is coupled with fourth region 14 in an electrically conductive manner via a contact arrangement 705 of damping device 7 and, particularly, is configured so as to be electrically insulated from fifth region 15. Moreover, micromechanical component 1 may be configured in such a way that second counter-electrode element 702 is coupled with fifth region 15 in an electrically conductive manner via a further contact arrangement 707 and, particularly, is configured so as to be electrically insulated from fourth region 14. First element 501, first counter-electrode element 701 and/or second counter-electrode element 702 may be disposed in overlapping fashion along a projection direction parallel to deflection direction 101. Moreover, first element 501, first counter-electrode element 701 and/or second counter-electrode element 702 is/are configured as electrode finger(s). In particular, micromechanical component 1 is configured in such a way that an interaction between first element 501 and first counter-electrode element 701 and/or second counter-electrode element 702 as well as between further first element 501' and first counter-electrode element 701 and/or second counter-electrode element 702 contributes to the damping forces in a deflection movement of deflection device 5 and/or damping device 7.

Micromechanical component 1 may include a plate-type capacitor. The plate-type capacitor especially may include first element 501 and first counter-electrode element 701. In addition, micromechanical component 1 may include a further plate-type capacitor, which especially particularly encompasses further first element 501' and first counter-electrode element 701. Moreover, deflection device 5 may include a first electrode, and damping device 7 includes a second electrode, the first electrode and the second electrode interacting with each other and, for example, providing an action of force for a drive of micromechanical component 1 and/or providing a possibility for the detection of an action of deflection or an action of force.

As an alternative, it may be provided that deflection device 5 and damping device 7 lie at an electrical potential or supply an electrical potential, in particular in regions that interact with one another.

Damping device 7 may include a damping finger 703, and especially particularly, five or six damping fingers 703. Here, damping finger 703 may be disposed in third recess 530. As shown in FIG. 1 by way of example, damping finger 703 may be connected to third region 13 in an intermaterial and movable manner. In other words, third region 13 particularly provides a corridor, which allows for a connection of damping finger 703 to a center-mass potential and for the simultaneous use of a first counter-electrode element 701 and/or a second counter-electrode element 702.

Figure 2:
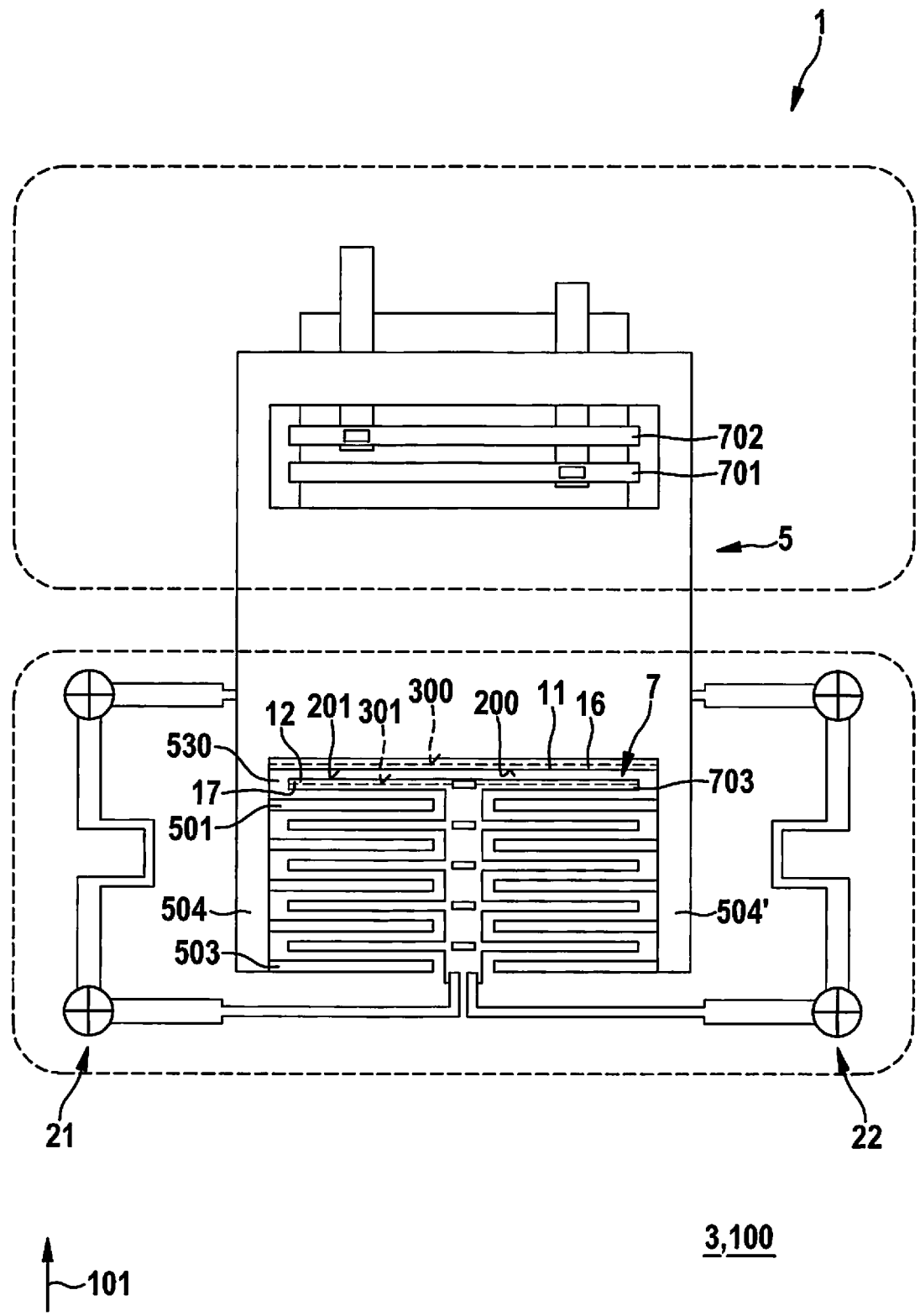
FIG. 2 shows another schematic representation of micromechanical components according to an exemplary embodiment of the present invention.

In the micromechanical component 1 shown in FIG. 2 by way of example, damping device 7 does not include a first counter-electrode element 701 and a second counter-electrode element 702. In other words, in the micromechanical component 1 shown in FIG. 2 by way of example, the bilateral mobile detection is dispensed with and only deflection device 5 and damping device 7, in particular damping finger 703 of damping device 7, is designed to be bilaterally movable. In other words, micromechanical component 1 shown in FIG. 2 by way of example may include comb fingers that are movable toward each other, which may be bilaterally. Deflection device 5 may include first comb fingers, and damping device 7 includes second comb fingers, the first comb fingers and the second comb fingers being designed to allow a movement toward one another, in particular parallel to deflection direction 101. This advantageously makes it possible to dispense with a separation, in particular an electric/galvanic separation, into third region 13 and fourth region 14, and/or fifth region 15. Thus, FIG. 2 shows a micromechanical component 1 by way of example, in which the detection has a classic design, and the part featuring the active damping is designed to allow a movement in a bilateral manner.

Moreover, it is shown in FIG. 2 by way of example that micromechanical component 1 includes a first counter-electrode element 701 and a second counter-electrode element 702, each particularly being configured as a solid electrode. In other words, first counter-electrode element 701 and second counter-electrode element 702 are coupled with or connected to substrate 3, which may be immovably, thereby making it possible to detect the deflection of deflection device 5 parallel to deflection direction 101 relative to substrate 3.

For example, micromechanical component 1 includes a first coupling device 21 and a second coupling device 22. First coupling device 21 and second coupling device 22 may be mechanical coupling structures. In other words, micromechanical component 1 is configured in such a way that first coupling device 21 and second coupling device 22 jointly couple deflection device 5 and damping device 7 to each other mechanically. As an alternative, first coupling device 21 and second coupling device 22 are electric coupling structures in each case. Here, micromechanical component 1 may be configured in such a way that a deflection of deflection device 5 parallel to deflection direction 101 is measurable with the aid of first coupling device 21 and/or second coupling device 22. An action of force is able to be exerted on damping device 7, which may be by first coupling device 21 and/or second coupling device 22, in such a way that damping device 7 is deflectable parallel and counter to deflection direction 101. In other words, micromechanical component 1 is configured in such a way that first coupling device 21 and second coupling device 22 jointly couple deflection device 5 and/or damping device 7 with each other electrically or electrostatically. Especially particularly, first coupling device 21 and second coupling device 22 include comb structures or plate structures in each case, which electrostatically interact with additional comb structures or with additional plate structures of deflection device 5 and/or damping device 7.

FIG. 2 shows by way of example that damping finger 703 is mechanically coupled with deflection device 5 directly via first coupling device 21 and second coupling device 22. Damping finger 703 and deflection device 5 may be kept at one and the same electrical potential. This advantageously provides a merely mechanically acting damping structure in addition to electrically active components, or also without electrically active components of damping device 7. Thus, in order to increase the damping effect, it is advantageously possible to utilize additional finger structures whose sole purpose consists of increasing the damping.

In addition, FIG. 1 shows by way of example that first coupling device 21 includes a first coupling element 31, which has a first leg 41 and a second leg 42, as well as a second coupling element 32, which has a third leg 43 and a fourth leg 44. First leg 41 is coupled with deflection device 5, which may be in a resilient manner, while second leg 42 is connected, which may be in a rigid manner, to first leg 41 at a connection point 51. Here, first leg 41 and second leg 42 may be disposed in a plane parallel to main extension plane 100 at a right angle with respect to each other. Furthermore, first leg 41 and second leg 42 are connected to substrate 3, which may be so as to allow pivoting about a first pivot axis 51 that extends in a perpendicular direction to main extension plane 100 and intersects first connection point 51. First coupling element 31 and second coupling element 32 are essentially designed in identical fashion, in particular in mirror symmetry. Second coupling element 32 is configured so as to be pivotable about a second pivot axis 52 or about a second connection point 52. In addition, fourth leg 44 is connected to damping device 7, which may be in a resilient manner. Second leg 42 and third leg 43 are coupled with each other, which may be in a resilient manner and with the aid of a spring arrangement 35 of first coupling device 21. Moreover, micromechanical component 1, which may be spring arrangement 35, is particularly configured in such a way that second leg 42 and third leg 43 are electrically insulated from each other. This is indicated by a dashed line between second leg 42 and third leg 43, the dashed line intersecting spring arrangement 35. In addition, legs 41, 42, 43, 44 may have identical or different leg lengths 310, 320, 330, 340, respectively, in order to achieve a particular translation ratio of the coupling between deflection device 5 and damping device 7. In principle, different translation ratios are able to be adjusted between the deflections of deflection device 5 and damping device 7 through the selection of different leg lengths 310, 320, 330, 340 of first coupling device 21 and/or second coupling device 22.

Second coupling device 22 shown in FIG. 1 by way of example is configured or disposed essentially like first coupling device 21 but in mirror symmetry with first coupling device 21 with respect to a mirror plane that extends perpendicular to main extension plane 100 and parallel to deflection direction 101. Micromechanical component 1 shown in FIG. 1 includes a further first coupling device 21' and a further second coupling device 22'. Further first coupling device 21' and further second coupling device 22' are essentially configured and disposed like first coupling device 21 and second coupling device 22 but in mirror symmetry with first coupling device 21 and second coupling device 22 with respect to a respective mirror plane that extends in a perpendicular direction to deflection direction 101. Micromechanical component 1 may be configured in such a way that first coupling device 21 and further first coupling device 21' in each case couple deflection device 5 with fourth region 14, and second coupling device 22 and further second coupling device 22' couple deflection device 5 with fifth region 15, in particular mechanically.

In other words, micromechanical component 1 includes a damping structure or a damping device 7, which is mechanically coupled with deflection device 5. In response to a deflection, deflection device 5 activates a deflection mechanism or first coupling device 21 and/or second coupling device 22, with the result that damping device 7 is moved in the direction of deflection device 5.

In addition, damping structure 7 may be configured for the capacitive detection of a deflection of deflection device 5, which may be parallel to deflection direction 101, as a function of a distance 400, which may be parallel to deflection device 101, between first element 501 and first counter-electrode element 701, and/or as a function of a further distance 400', which may be parallel to deflection direction 101, between further electrode element 501' and first counter-electrode element 701. First counter-electrode element 701 may have a counter-electrode width 710 that is smaller than a recess width 510' of recess 510. Here, both counter-electrode width 710 and recess width 510' extend parallel to deflection direction 101. Micromechanical component 1 may be configured in such a way that in response to a deflection of deflection device 5 by a travel x, distance 400 or further distance 400', or the effective gap between the structures, changes by twice the travel (i.e. 2x). In other words, a deflection of deflection device 5 parallel to deflection direction 101 by a travel x results in a change in distance 400 or further distance 400' by a travel of 2x. Distance 400 may increase or further distance 400' may drop by a travel 2x in a deflection of deflection device 5 parallel to and in the direction of deflection direction 101. In addition, distance 400 is reduced or further distance 400' is increased by a travel 2x in a deflection of deflection device 5 parallel and counter to the direction of deflection direction 101. As a result, micromechanical component 1 according to the present invention advantageously makes it possible to considerably increase the damping force in a deflection of deflection device 5 and damping device 7, in particular on account of the more rapidly diminishing gap in comparison with conventional topologies.

Through a deflection of deflection device 5 parallel to and in the direction of deflection direction 101 and a deflection of damping device 7 parallel and counter to deflection direction 101, distance 400 is increased considerably in comparison with further distance 400'. First coupling device 21 and second coupling device 22 cause first counter-electrode element 701 to be moved away from electrode element 501 and towards further electrode element 501'. Here, in response to a deflection of deflection device 5 by a travel distance, distance 400 is increased by twice the travel, in particular in the simplest case.

FIG. 3 shows damping structures by way of example, the damping structures encompassing parts of deflection device 5 and damping device 7. The damping structures encompass a locally enlarged plate height h, in particular. Furthermore, region 11 of deflection device 5 perpendicular to main extension plane 100 may have a lower height than a sixth region 16 of deflection device 5 facing damping device 7. In addition, further region 12 of damping device 7 perpendicular to main extension plane 100 may have a lower height than a seventh region 17 of damping device 7 facing deflection device 5. In other words, deflection device 5 and/or damping device 7 has/have a respective height that is less than that of damping plates that are coupled with deflection device 5 and/or damping device 7, which may be in an intermaterial manner.

In addition, micromechanical component 1 may be configured in such a way that first element 501 and/or further first element 501' and/or second element 502 and/or further second element 502' and/or third element 503 and/or connection element 504 and/or further connection element 504' include(s) a surface 200 of deflection device 5 that faces damping device 7 in each case. Respective surface 200 is greater than a respective sectional area 300 of deflection device 5 disposed perpendicular to deflection direction 101 and situated in a respective region 11 of deflection device 5 facing away from damping device 7.

In addition, micromechanical component 1 may be configured in such a way that first counter-electrode element 701 and/or second counter-electrode element 702 and/or damping finger 703 in each case encompass(es) a further surface 201 of damping device 7 facing deflection device 5. The respective further surface is greater than a further sectional area 301 of damping device 7 disposed perpendicular to deflection direction 101 and situated in a further region 12 of damping device 7 that is facing away from deflection device 5 in each case.

Thus, it is advantageously possible that in addition to the electrical properties, the mechanical damping properties of micromechanical component 1 are also able to be influenced in a selective manner with the aid of electrodes, which may be detection electrodes, that move towards one another.

A deflection of deflection device 5 along deflection direction 101 may be detected in a capacitive manner in order to detect a translational movement and/or a rotational movement of micromechanical component 1. In the following text, an operating method of micromechanical component 1 according to the present invention is described by way of example and with the aid of first coupling device 21. The description accordingly also applies to second coupling device 22, further first coupling device 21' and to further second coupling device 22'.

In a first operating step, deflection device 5 is deflected in the direction of deflection direction 101, for instance due to an acceleration force or a Coriolis force that is acting on deflection device 5 in the direction of deflection direction 101.

In a second operating step, a pivoting movement of first coupling device 21 is induced as a function of the deflection of deflection device 5 in the direction of deflection direction 101. In the process, a first end of first leg 41, which is resiliently coupled with deflection device 5, is carried along in the direction of deflection direction 101 in such a way that a first pivoting movement of first coupling element 31 about first pivot axis 51 is induced, which may be in the image plane of FIG. 1 in a counter-clockwise manner. Due to the resilient coupling between first coupling element 31 and second coupling element 32—in this case, with the aid of spring arrangement 35, i.e. between second leg 42 and third leg 43—, second coupling element 32 a second pivoting movement of second coupling element 32 about second pivot axis 52 is generated, which may be in the image plane of FIG. 1 in a clockwise direction. As a result, fourth leg 44 pivots in a direction counter to deflection direction 101. This causes damping device 7, which is resiliently coupled with fourth leg 44, to be deflected in parallel and counter to deflection direction 101. In a similar manner, an oppositely directed deflection of deflection device 5 parallel with but counter to deflection direction 101 conversely causes a deflection of damping device 7 parallel but counter to deflection direction 101, in particular.

Micromechanical component 1 according to the present invention is advantageous in particular in comparison with conventional inertial sensors which encompass fixed structures as well as movable structures. In comparison with the related art, advantages especially with regard to a required surface space as well as improved clipping behavior result from micromechanical component 1 according to the present invention.

Speed-dependent damping forces, in particular, are built up by the movement of structures or deflection device 5 and/or damping device 7. The damping forces are created as a result of different physical effects. One of a plurality of these damping contributions is known as squeeze-film damping, which is produced when movable structures move toward solid structures. Here, a medium, which may be a gas medium, for example, is compressed between the structures. A damping contribution, also referred to as inverse quality, by squeeze-film damping at a long rectangular plate having a length L, a height h and a gap or distance d, for instance, may be analytically estimated by $$Q_{Squeeze}^{-1} = \frac{\mu_{eff}}{m\omega} \frac{L_{eff} h_{eff}^3}{d^3}$$

Figure 4:
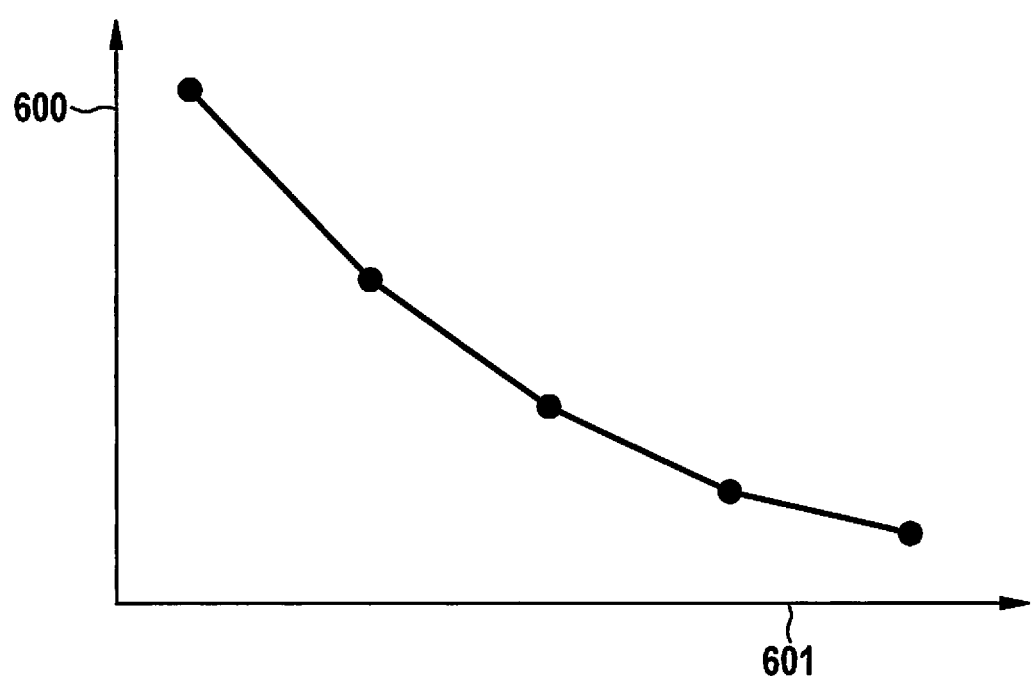
FIG. 4 shows a schematic representation of a damping force as a function of a distance between two structures of a micromechanical component according to an exemplary specific embodiment of the present invention.

Here, $\mu_{eff}$ denotes the effective viscosity of the medium, which may be a surrounding gas, m denotes the mass, and $\omega$ denotes the angular frequency of the plate that is oscillating against a wall, in particular harmonically. According to the present invention, micromechanical component 1 may include a medium having a viscosity that is adapted to the desired damping forces. The effect is therefore heavily dependent upon the gap width between fixed and movable structures. The smaller the residual gap and the higher the velocity, the higher the damping force. In addition, a significant dependency also results from the height of the plate. A numerical simulation of a normalized inverse detection quality 600 as a function of a/the gap distance 601 is shown in FIG. 4 by way of example for a micromechanical component 1 or a rate-of-rotation sensor.

What is claimed is:

1. A micromechanical component, comprising:
a deflection device, which is deflectable along a deflection direction; and
a damping device;
wherein an area of a surface of the deflection device facing the damping device is greater than a sectional area of the deflection device disposed perpendicular to the deflection direction and situated in a region of the deflection device facing away from the damping device, and
wherein the deflection device and the damping device are relatively movable toward each other and away from each other.

2. The micromechanical component of claim 1, wherein an extension of the surface perpendicular to a main extension plane of a substrate of the micromechanical component extending parallel to the deflection direction is greater than an extension of the sectional area perpendicular to the main extension plane.

3. The micromechanical component of claim 1, wherein an extension of the surface parallel to a main extension plane of a substrate of the micromechanical component extending parallel to the deflection direction is greater than an extension of the sectional area parallel to the main extension plane.

4. The micromechanical component of claim 1, wherein a further surface of the damping device facing the deflection device is greater than a further sectional area of the damping device that is disposed perpendicular to the deflection direction and is situated in a further region of the damping device facing away from the deflection device.

5. The micromechanical component of claim 1, wherein an extension of the further surface perpendicular to a main extension plane of a substrate of the micromechanical component extending parallel to the deflection direction is greater than an extension of the further sectional area perpendicular to the main extension plane.

6. The micromechanical component of claim 1, wherein an extension of the further surface parallel to a main extension plane of a substrate of the micromechanical component extending parallel to the deflection direction is greater than an extension of the further sectional area parallel to the main extension plane.

7. The micromechanical component of claim 1, wherein the damping device is deflectable parallel to the deflection direction, and the micromechanical component is configured so that a deflection of the deflection device along the deflection direction causes a deflection of the damping device counter to the deflection direction.

8. The micromechanical component of claim 1, wherein the micromechanical component is configured so that a first projection of the deflection device onto a main extension plane of a substrate of the micromechanical component extending parallel to the deflection direction and a second projection of the damping device onto the main extension plane overlap.

9. The micromechanical component of claim 1, wherein the damping device includes a third region and a fourth region that is separated from the third region.

10. The micromechanical component of claim 1, wherein the damping device includes a fifth region that is separated from the third region and/or from the fourth region.

11. The micromechanical component of claim 1, wherein the damping device includes a fifth region that is separated galvanically from the third region and/or from the fourth region.

12. The micromechanical component of claim 1, wherein the damping device includes a third region and a fourth region that is separated galvanically from the third region.

* * * * *